(12) United States Patent
McLeod

(10) Patent No.: US 8,895,233 B2
(45) Date of Patent: Nov. 25, 2014

(54) THREE-DIMENSIONAL DIRECT-WRITE LITHOGRAPHY

(71) Applicant: The Regents of the University of Colorado, a body corporate, Denver, CO (US)

(72) Inventor: Robert R. McLeod, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 13/852,957

(22) Filed: Mar. 28, 2013

(65) Prior Publication Data

US 2013/0214439 A1    Aug. 22, 2013

Related U.S. Application Data

(62) Division of application No. 11/993,015, filed as application No. PCT/US2006/023520 on Jun. 16, 2006, now Pat. No. 8,597,871.

(60) Provisional application No. 60/691,471, filed on Jun. 18, 2005.

(51) Int. Cl.
*G03F 7/20* (2006.01)
*G02B 6/12* (2006.01)
*B29C 59/16* (2006.01)
*B29C 35/08* (2006.01)

(52) U.S. Cl.
CPC . *B29C 59/16* (2013.01); *G02B 6/12* (2013.01); *G03F 7/2053* (2013.01); *G03F 7/70416* (2013.01); *B29C 2035/0838* (2013.01); *G03F 7/70025* (2013.01); *G02B 6/12002* (2013.01)

USPC ............. 430/321; 385/14; 385/51; 385/146; 430/320

(58) Field of Classification Search
CPC ........... B29C 2035/0838; B29C 35/08; G03F 7/70416; G03F 7/70025; G03F 7/2053; G02B 6/12; G02B 6/12002
See application file for complete search history.

(56) References Cited

U.S. PATENT DOCUMENTS 3,809,732 A    5/1974   Chandross et al.
4,240,849 A  * 12/1980   Kurokawa et al. ........... 156/73.2
(Continued)

FOREIGN PATENT DOCUMENTS

JP    59-192219 A    10/1984
JP    06-337320   *  12/1994
(Continued)

OTHER PUBLICATIONS

Gale et al. "Fabrication of continuous relief micro-optical elements by direct laser writing in photoresists", Opt. Eng., vol. 33(11) pp. 3556-3566 (Nov. 1994).*

(Continued)

*Primary Examiner* — Martin Angebranndt
(74) *Attorney, Agent, or Firm* — Perkins Coie LLP

(57) ABSTRACT

A method of creating a region of index change in a photopolymer includes providing a photopolymer having a photosensitivity to light of a particular wavelength and creating a region of index change in the photopolymer by applying direct write lithography to expose the photopolymer of the region to light that includes the particular wavelength.

11 Claims, 4 Drawing Sheets

(56) References Cited

U.S. PATENT DOCUMENTS

| | | | |
|---|---|---|---|
| 4,487,475 A | | 12/1984 | Ogawa |
| 5,359,687 A | * | 10/1994 | McFarland et al. ............ 385/49 |
| 6,809,824 B1 | | 10/2004 | Yates et al. |
| 7,212,723 B2 | * | 5/2007 | McLeod et al. ............... 385/147 |
| 2004/0173761 A1 | | 9/2004 | Noehte et al. |
| 2004/0223385 A1 | * | 11/2004 | Fleming et al. ............... 365/202 |
| 2005/0271336 A1 | | 12/2005 | Galstian et al. |
| 2009/0218519 A1 | * | 9/2009 | McLeod .................... 250/492.1 |

FOREIGN PATENT DOCUMENTS

| | | | |
|---|---|---|---|
| JP | 09-318831 | * | 12/1997 |
| JP | 2003-156643 | * | 5/2003 |
| WO | 01/96917 | * | 12/2001 |

OTHER PUBLICATIONS

Kagawa et al. "Fabrication of optical components and modules using photo-fabrication technique", Opt. Rev., vol. 4(6) pp. 639-642 (1997).*

Cogswell, C. J. et al., "Colour Confocal Reflection Microscopy Using Red, Green and Blue Lasers," Journal of Microscopy, vol. 165, Pt. 1, pp. 103-117, Jan. 1992.

Hatab, Ziad R. et al., "Optical Diffraction Tomography for Latent Image Metrology," SPIE, vol. 3050, pp. 515-524, 1997.

Jekauc, Igor et al., "Metal Etcher Qualification Using Angular Scatterometry," Proc. of SPIE, vol. 5752, pp. 259-271, Jun. 21, 2005.

* cited by examiner

THREE-DIMENSIONAL DIRECT-WRITE LITHOGRAPHY

CROSS-REFERENCES TO RELATED APPLICATIONS

This application is a divisional of U.S. patent application Ser. No. 11/993,015, filed on Dec. 18, 2007, entitled "Three-Dimensional Direct-Write Lithography," which is a national stage of International Application No. PCT/US2006/23520, filed on Jun. 16, 2006, entitled "Three-Dimensional Direct-Write Lithography," which claims the benefit of U.S. Provisional Patent Application No. 60/691,471, filed on Jun. 18, 2005, entitled "Hybrid Integrated Photonics," the entirety of each of which are herein incorporated by reference for all purposes.

This application is related to co-pending, commonly assigned U.S. patent application Ser. No. 11/357,737, entitled "MONOLITHIC WAVEGUIDE ARRAYS," then entirety of which is herein incorporated by reference for all purposes.

BACKGROUND OF THE INVENTION

This application relates generally to optical packaging systems and methods. More specifically, this application relates to optical packaging and circuit fabrication systems and methods using three-dimensional, direct-write lithography.

Present optical packaging systems are a direct descendant of gun sights developed in WW II in which optics are manually aligned and then epoxied to machined metal scaffolds. The results are typically unreliable, large, expensive and of limited complexity due to the moderate individual yield. Traditional planar lightwave circuits can fabricate complex optical interconnections but are generally unable to incorporate hybrid subcomponents and thus can only implement devices encompassed by a single material system. An alternative approach is to reduce the scale of the "scaffold" via lithographic silicon micro-machining, but the precise and identical nature of each silicon bench demands similar tolerances for the subcomponents that are not economically feasible.

The use of 3D direct-write lithography to form localized permanent index changes in glass with femto-second lasers was first published in 1996. Since then, there have been demonstrations of optical waveguides written both parallel and perpendicular to the writing light, and beam shaping to make perpendicular waveguides with symmetric profiles. There have also been demonstrations that take advantage of the full three-dimensional (3D) capabilities of the direct-write system such as a 1×3 splitter, 3-waveguide directional coupler, and a microring resonator. One feature of this method is that the extremely high power of the ultra-short pulsed laser induces nonlinear absorption at the focus in order to locally change the properties of the glass.

Planar (2D) direct write lithography is well known as a method to form planar waveguides. By employing a material with linear sensitivity, such as photopolymer, the laser power requirements can be reduced sufficiently to enable continuous (not pulsed) sources, producing naturally smooth guides. The polymers used are related to photoresists in that the laser polymerizes the thin (order several microns) monomer layer at focus and a subsequent solvent wash removes all unexposed material. An optional overcoat of a cladding material completes the process. This material process is not compatible with deeply buried, 3D structures.

The Dupont® company commercialized the use of a sensitive volume photopolymer in place of glass for use in holography. Such materials require no wet processing step. Dupont® also applied this material to planar (2D) optical waveguide fabrication and to laminated 3D circuits. By cutting slots in 2D, lithographically-formed planar polymer waveguides, one can insert thin optical components such as Faraday rotators to implement hybrid optical circuits. These slots are filled with liquid monomer and cured in place to reduce reflection losses. Only limited functionality can be attained by this method since the hybridized components must be thin (to minimize diffraction losses within the part) and optically flat to much less than a wavelength (to minimize coupling losses). More traditional hybridization methods use silicon etching to make miniature optical "benches" to hold precisely fabricated (i.e. expensive) hybrids to silicon waveguides. Similar methods have recently been applied to planar lithographic polymer waveguides for optical backplane interconnects including the encapsulation of a vertical cavity laser in the polymer.

More recently, Toyota® has embedded a plastic optical fiber and a wavelength multiplexing filter into a thick polymer in order to make a cheap, robust component for use in autos. The polymer was a traditional expose-and-rinse material, not the self-developing polymer discussed above, limiting the guides to be large and multi-mode. In this example, a multi-mode waveguide was written in the photopolymer by embedding a multi-mode plastic optical fiber into the material, then letting light from the fiber "self-write" a waveguide by locally polymerizing the material, thus creating a weak lens, and propagating light through the material in a soliton-like fashion. This technique has limited control over the shape and direction of the resulting waveguides, and single mode operation has not yet been demonstrated over a significant distance. Very little to no control over the waveguide shape, size or direction is given with this method.

BRIEF SUMMARY OF THE INVENTION

Embodiments of the present invention provide a method of creating a region of index change in a photopolymer. The method includes providing a photopolymer having a photosensitivity to light of a particular wavelength and creating a region of index change in the photopolymer by applying direct write lithography to expose the photopolymer of the region to light that includes the particular wavelength. The region of index change may be a localized mark of index change or a trajectory through space. A cross section of the region of index change may vary along the trajectory. The region of index change may be a two-dimensional pattern of index change having substantially no variation in a third dimension. The region of index change may be a three-dimensional pattern of index change. The region of index change may be an optical device. The optical device may be a lens, a waveguide, a grating, a prism, and/or the like. The method my include providing a dopant doped into the photopolymer. The method may include exposing the photopolymer to uniform incoherent light to thereby cure the polymer.

Other embodiment provide a method of creating an optical interconnect. The method includes embedding at least a portion of an optical component in a photopolymer having a photosensitivity to light of a particular wavelength and creating a region of index change in the photopolymer by exposing the photopolymer in the region to light of the particular wavelength to thereby form the interconnect. At least one end of the region is aligned to the embedded optical component. The optical component maybe an optical fiber, a dielectric thin-film structure, a crystal optics device, a lens, a waveguide, a laser, an electro-optic device, an acousto-optic device, a liquid crystal device, a photodetector, a nonlinear optic device, and/or the like. The step of creating a region of index change may be performed after the step of embedding at least a portion of the optical component. The method may include exposing the photopolymer to uniform incoherent light to thereby cure the polymer. The method may include determining a location, in three dimensions, for the interconnect after the component is embedded.

Still other embodiments provide a three-dimensional direct write lithography device. The device includes a positioning system configured to position a target device and a writing beam relative to one another. The target device may be a photopolymer that is sensitive to light of a particular wavelength. The device also includes a detection arrangement, including a first source of light outside a photosensitivity range of the photopolymer. The detection arrangement is configured to determine a location in space of the target device, including the location of the photopolymer. The device also includes a writing arrangement, including a second source of light of the particular wavelength. The writing arrangement is configured to create a region of index change in the photopolymer by exposing the photopolymer in the region to light emitted by the source of light. The writing arrangement is responsive to location information determined by the detection arrangement. The target device may include an optical component and the detection arrangement may be configured to determine a location of the optical component and the writing arrangement may be configured to create an interconnect in the photopolymer, at least one end of which is aligned to the optical component. The detection arrangement may be configured to determine a location of light at least partially passing through the target device and the writing arrangement may be configured to create an interconnect in the photopolymer, at least one end of which is aligned to the light. The second source of light may be a 532 nm frequency-doubled Nd:YAG laser. The second source of light may have output power in the range from about 1 to about 30 μW.

BRIEF DESCRIPTION OF THE DRAWINGS

A further understanding of the nature and advantages of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Overview

Figure 1:
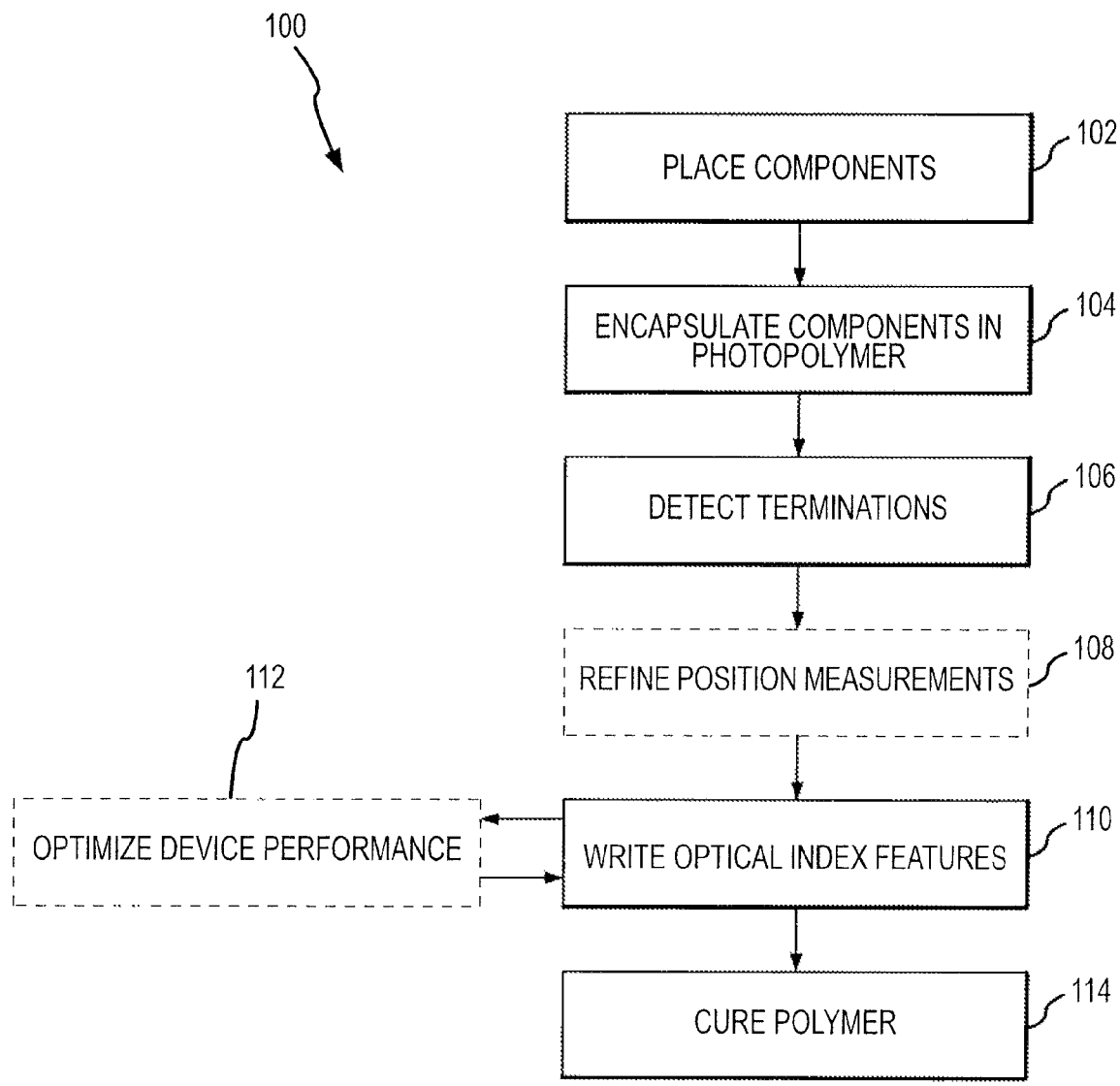
FIG. 1 provides an exemplary 3D direct-write lithography method according to embodiments of the invention.

Embodiments of the present invention provide optical packaging and circuit fabrication systems and methods that are compatible with hybrid integration of virtually any optoelectronic component. Specific embodiments employ a three-dimensional direct-write lithography system capable of writing deeply-buried, localized index structures into diffusion-mediated photopolymer, providing advantages including greater flexibility in the writing media and the ability to use low power, inexpensive, continuous-wave lasers. Index structures are written both parallel and perpendicular to the writing beam in different types of photopolymers, providing control over the feature size and shape. Exemplary embodiments provide systems that are fully automatic, compact, mechanically robust, and inexpensive to operate for both large and small production volumes.

Certain embodiments provide low cost and short processing cycles. Circuit components are assembled with loose-tolerances, then a single machine, which consists of little more than several low-power lasers and a precise stage system, completes the remaining process steps. This includes fiber pigtailing and external packaging, producing a part that is ready to ship after it comes off of the machine.

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention. It is to be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, systems may be shown in block diagrams in order not to obscure the embodiments in unnecessary detail. In other instances, well-known processes, structures and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

While embodiments of the invention will be described herein with respect to creating optical waveguides connecting the components of a multi-chip module, which waveguides are deeply embedded in the photopolymer media, embodiments of the present invention may be employed toward single component systems up to complex integrated optoelectronic systems. Exemplary applications include:

Tight-tolerance optical components. In many applications the cost of the packaging process typically dominates the bill of materials. For example, optical ribbon connectors can cost several hundred dollars a pair due to tight tolerances and associated specialized materials. Embodiments of the invention can relax the tolerances by an order of magnitude and replace costly materials with plastic. In some embodiments, such advantages are realized in semi-conductor laser diodes pigtailed to optical fiber and/or mechanically coupled to external cavities to provide tunable wavelength stabilization.

Telecom/datacom, e.g. 10 Gb Ethernet. Components to support long haul, metro, and local network communication consist of a broad range of functionality including sources, modulators, wavelength mux/demux, and detectors. Most of these components are not highly integrated due to the lack of a high-yield manufacturing platform with the result that the costs are dominated by packaging. This high cost in turn prevents penetration into larger markets such as fiber-to-the-home. Embodiments of the present invention provide an integration platform capable of reducing system costs to that of the necessary subcomponents and a plastic package.

Ultra-short reach or "optical back plane." Data rates in super computers like the IBM BlueGene exceed 10 s of TB/s. Even lowly desktop machines are pushing 10 s of GB/s across boards. For the same reasons that optics overtook copper in the long-haul network, optics is seen as the natural communication medium for board-to-board communication. Embodiments of the present invention enable all-plastic, loose-tolerance physical-layer interconnects that offer ultra high bandwidths and low loss.

Exemplary Method Embodiment

Having described embodiments of the present invention generally, attention is directed to FIG. 1, which illustrates an exemplary method 100 according to embodiments of the invention. The method relates to direct write lithography into a diffusion-mediated photopolymer. Those skilled in the art will appreciate that this method is not limiting. There are other methods of creating local, permanent index change in polymers, such as two-photon initiation. Those skilled in the art also will appreciate that the method 100 is merely exemplary of a number of methods according to the present invention. For example, the foregoing description is specifically directed toward forming a waveguide connecting optical components, although this is not to be considered limiting. Further, those skilled in the art also will appreciate that other methods according to other embodiments may include more, fewer, or different steps than those illustrated herein. Further still, other methods according to other embodiments may traverse the steps in different orders than that illustrated and described herein.

According to the method 100, light that includes a wavelength that initiates polymerization is focused into the bulk of a photopolymer sample, thereby creating a region of index change in the sample. The light may be provided by a lamp, a LED, a laser, and/or the like. The size and shape of the writing beam may be altered to thereby alter the size and shape of the region. Similarly, the light and sample may be translated with respect to one another to thereby alter the size and shape of the region. The translation may be perpendicular or parallel to the writing beam or any combination thereof. The region may be a single dot, or localized mark, of index change within the sample, a generally one-dimensional line segment (i.e., a trajectory through the sample) or two-dimensional pattern of index change within the sample (i.e., the 2D pattern has substantially no variation in the third dimension), a three dimensional pattern of index change, or any combination. The cross section of regions of index change that form a trajectory through the sample may vary along the trajectory or remain substantially constant. Two or more line segments may form a three-dimensional region, such as a waveguide. A three-dimensional region may be formed to thereby create an optical device, such as a lens, grating, prism, and/or the like. Many other possibilities exist.

The photopolymer responds to the light with an index change that is nearly proportional to the time integral of the writing intensity, creating gradient index structures that resemble the shape of the intensity profile of the writing beam. The index structures are thus confined in depth in the polymer, thereby allowing the writing of arbitrary 3D index structures. Exemplary photopolymers are sufficiently sensitive to the incident illumination to thereby allow the creation of index structures using very low intensities with inexpensive, low power, continuous wavelength (CW) lasers in some embodiments. The CW nature of the laser results in low scatter loss due to the smoothly varying index structure and enables writing speeds as fast as 20 m/s in exemplary embodiments. The large linear sensitivity also allows for the use of interference, or mask, lithography to record volume holograms or other large-area index structures. Changing the shape, power, and speed of the writing beam also allows waveguides or other gradient index structures written in the material to be continuously varied. Because of this flexibility in writing index structures coupled with the ability to embed optical elements in the material, photopolymers have the potential for hybrid integrated optical circuits that would incorporate many different types of materials and systems in a single package.

Continuing with a general description of this exemplary embodiment, photopolymers are composed of an initiator that absorbs incident light to form radicals, or other species that initiates polymerization (e.g., cations), and a monomer that polymerizes when it connects with the radicals. When exposed to light of the appropriate wavelength, the monomer polymerizes only in the area where the light hits the material. As the monomer is used up to form polymer chains, additional monomer diffuses into the areas where the material is exposed to light, resulting in areas of higher monomer density. The change in density creates a change of index of refraction in the material. Once the desired index change is achieved, the photopolymer is exposed to uniform, incoherent light, and the entire sample polymerizes, leaving the index change intact and the material insensitive to further light exposure. This process is called bleaching.

Having described the method 100 generally, attention is directed to blocks 102-112 of FIG. 1 and FIGS. 2A-2C for a more detailed description of the method 100. The method begins at block 102, at which point components 202 of a multi-chip module 204 are placed. Active components may be soldered to pads and components that extend beyond the circuit, such as fibers 206, may be clamped for strain relief. Positioning features on the substrate 208 may be used to locate the sub-components 202.

Figure 2A:
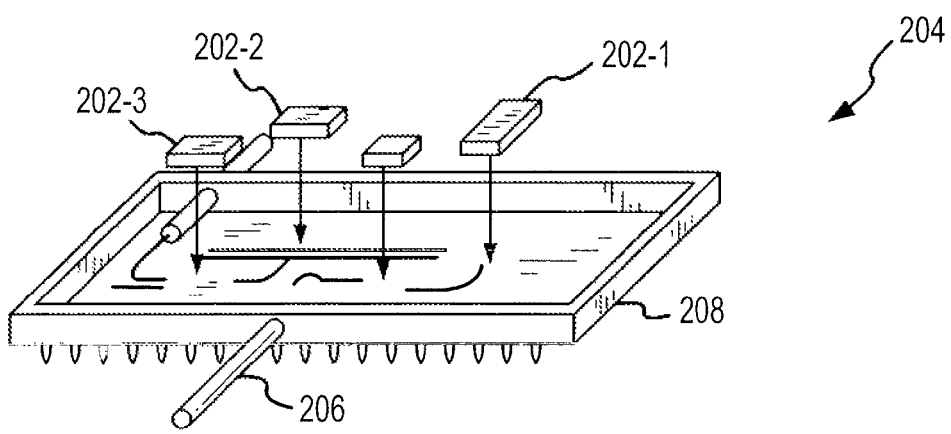
FIGS. 2A-2C illustrates an optical device in various stages of processing according to the method of FIG. 1.
Figure 2B:
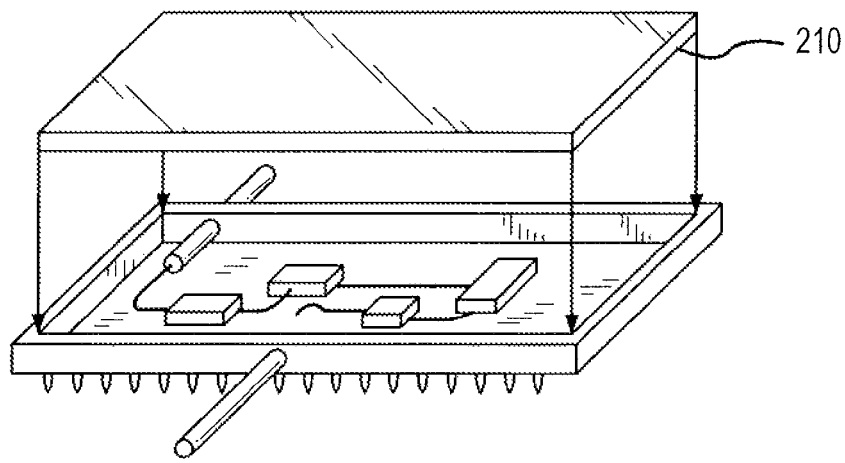

At block 104, the components 202 are encapsulated. The precursor of the monomer 210, which may be a liquid, a gel, and/or the like, is cast over the parts 202, a glass or polycarbonate cover, or other generally transparent material, may be added, and the monomer formulation is cured to its writing state. The step is illustrated at FIG. 2B. In a specific embodiment, the matrix cures at room temperature and thus is not limited in thickness by optical absorption or high temperature thermal stress. Physically, the polymer, in this specific embodiment, is the consistency of stiff rubber. Like an epoxy, the polymer naturally adheres to glass, plastic, and dielectric surfaces and thus encapsulates and locates the embedded parts.

At block 106, waveguide endpoints are determined. In a specific embodiment, the locations and tolerances of the components 202, 206 are detected with a scanning confocal microscope and a scanning transmission microscope that operate in the red, which is outside the sensitivity band of the photoinitiator. A system controller records the fabrication and location deviations and adjusts the interconnection design accordingly.

At block 108, the position measurements may be refined. For accessible components, light of the operational wavelength may be introduced from free space or fiber, depending on the desired input/output coupling of the circuit. As long as the light is outside the bandwidth of sensitivity, no polymerization is induced. The scanning microscope can refine its position measurements of the fiber tips, for example, by sensing the small scatter at the operational wavelength.

At block 110, optical index features are written into the polymer to thereby create waveguides. In a specific embodiment, a single focused green beam of moderate numerical aperture and very low power is scanned in three dimensions to selectively write index features. The response may be localized to the roughly 1 $\mu m^3$ voxel at the focus of the beam simply due to the intensity profile of the stylus. The shape of the focal volume can be modified. Waveguides may be written directly off of fiber tips and the acousto-optically patterned writing stylus can write lenses, gratings, or any other passive optic of relatively low (~0.1) index contrast.

At block 112, real-time feedback may be used to optimize device performance by monitoring the transmitted signals. Coupling efficiency, for example, may be maximized by detecting the distribution of the light to be coupled, comparing it to the target and adjusting lens or guide parameters to improve performance.

Figure 2C:
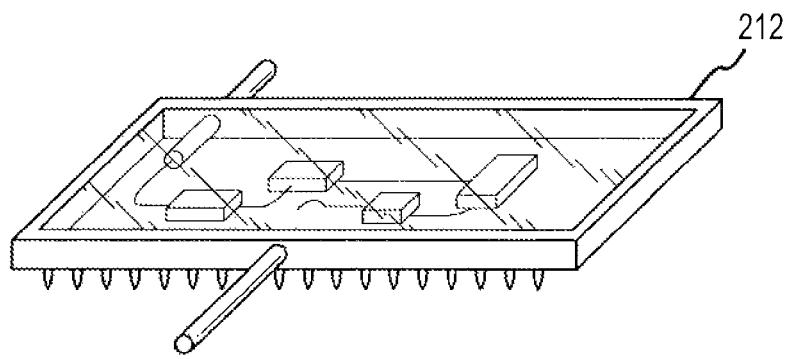

At block 114, the polymer is cured by exposing it to uniform incoherent light. FIG. 2C illustrates a completed device 212.

3D Direct Write Lithography System

Figure 3:
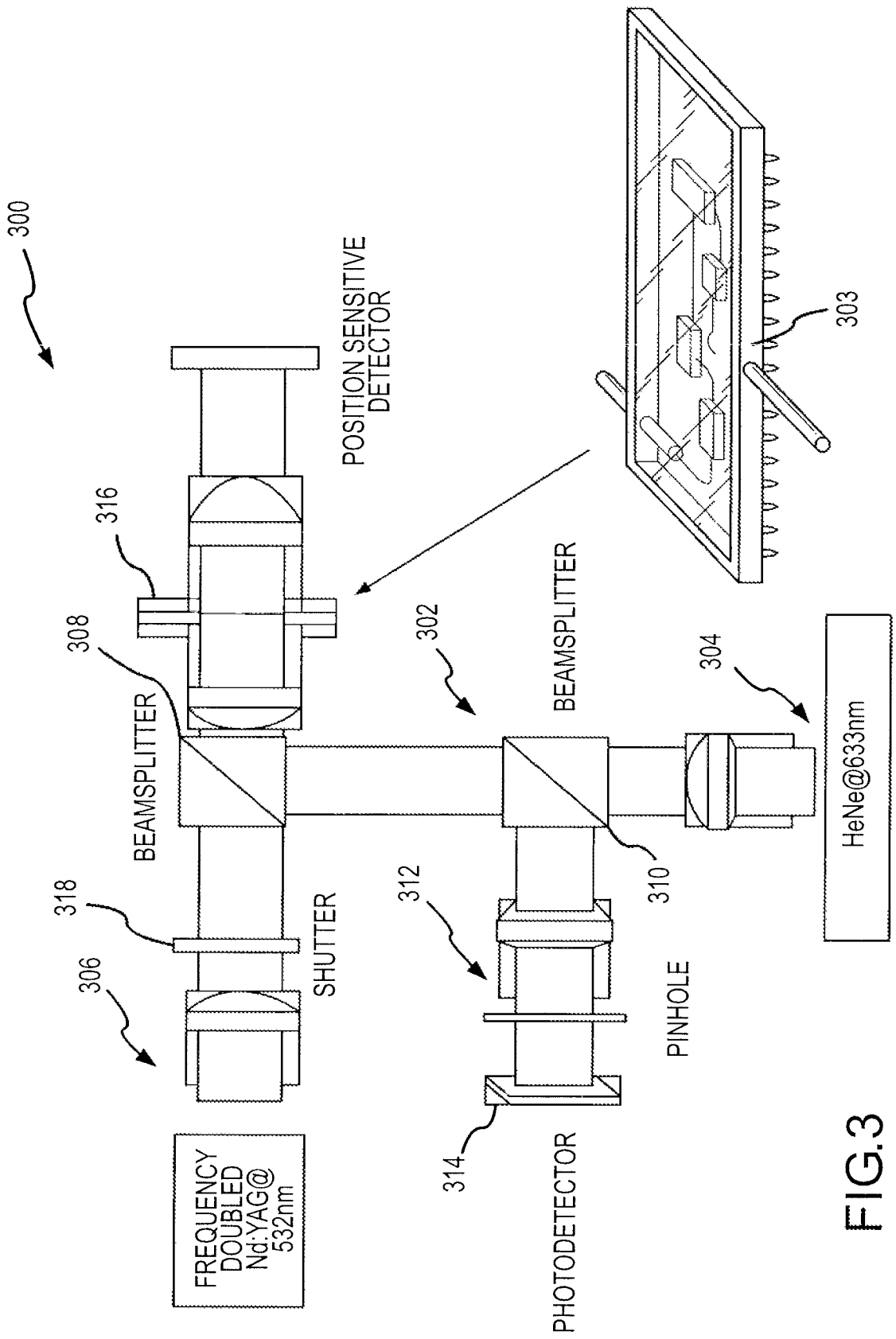
FIG. 3 illustrates a 3D direct write lithography system according to embodiments of the invention.

Having described an exemplary method 100 according to embodiments of the invention, attention is directed to FIG. 3, which illustrates a 3D read/write lithography device 300 according to embodiments of the invention. Those skilled in the art will appreciate that the device 300 is merely exemplary of a number of possible devices according to embodiments of the invention. The method 100 of FIG. 1 may be accomplished, in part, using the device 300.

The device 300 includes a scanning confocal microscope 302 for detecting the various component and photopolymer boundaries of the target optical device 303. In a specific embodiment, the photopolymer(s) used in the target device 303 is/are radical initiated InPhase Technologies Tapestry™ HDS 3000 media and cationic initiated Aprilis, Inc. HMC media, which are photoinitiated with 532 nm light. These materials are relatively insensitive at 633 nm. Hence, the microscope 302 employs a 633 nm, HeNe laser 304 for non-destructive scanning. Writing is accomplished using a frequency-doubled Nd:YAG laser 306 at 532 nm. Other exemplary writing lasers according to other embodiments have writing powers from 1-30 μW at the wavelength to which the photopolymer is sensitive.

During detection, red light from the scanning laser 304 is collimated, aligned with the write laser, and focused into the photopolymer of the target device 303. Light reflected from the focus propagates back through the system, reflects off of a first beamsplitter 308, a second beamsplitter 310, and focuses through a pinhole 312 where it is detected by a photodetector 314. Any reflections outside the depth of focus of the focused beam will be blocked by the pinhole 312 in front of the photodetector 314. In this way, the confocal microscope 302 detects the air/glass and glass/polymer boundaries to determine the exact position of the sample relative to the beam focus. Motorized linear stages 316 use these measurements at three transverse locations to precisely align the target device 303 orthogonal to the optical axis.

During writing, index lines may be written anywhere in the depth of the photopolymer of the target device 303, either parallel or perpendicular to the writing beam propagation. A writing beam is focused into the polymer with the same objective used for the detection system. Index structures are optically ruled by focusing the green laser into the center of the photopolymer and translating the material through the beam to draw index lines. Each line is written by opening a shutter 318 in the path of the green beam, moving the stages 316 to translate the target device 303, then closing the shutter 318 at the end of each line. In this way, light exposes only the polymer where the index lines are being written.

In a specific embodiment, the writing power is measured before the focusing objective and the speed of the stages 316 during the writing process is 2 mm/s. The writing speed may be a function of the photopolymer or may be limited by the speed of the motorized stages 316. Index structures may be written in certain cationic photopolymers at speeds up to 20 m/s. In specific embodiments, the writing laser is a continuous wavelength (CW) laser. Hence, there is no need to write slowly in order to integrate over many pulses to make the features smooth. The index change is inherently smooth, both along the line, because of the use of CW lasers, and transversely, because the index is the integral of a Gaussian beam. Waveguides made using this system exhibit low scattering loss and low dispersion.

Further details relating to detection and writing with respect to specific embodiments of the invention are provided immediately hereinafter.

Detection

According to specific embodiments of the invention, integration of detection and direct-write lithography into a common device allows embedded components in a target optical device to be first loosely positioned and then precisely located. Thereafter, the writing system customizes the positions of waveguides to the locations of the components. This is a substantial improvement over previously-known systems that locate physical components to pre-fabricated waveguides, then fix the components in place with epoxy or solder. In some specific embodiments, the detection methods are accurate to one micron or less to meet typical optical tolerances, which tolerances are enabled through the use of a microscopes in the detection apparatus. In order to avoid positioning errors that would occur from using a separate microscope and writing system, the same objective lens is used for both detection and writing. The microscope typically operates at a wavelength outside the sensitive band of the material, but for linearly sensitive materials this is typically a longer wavelength.

It should be appreciated that the detection is not limited to the methods described thus far with respect to specific embodiments. Possible methods include:

Confocal reflection microscopy. Light that does not expose the material is focused by the objective, reflects off of some feature in the part and returns to a pinhole which is in the image plane of the focus. This restricts the sensitivity to objects near the focus, enabling sharp boundaries normal to the optical propagation to be detected and accurately located.

Differential scanning transmission microscopy—A position-sensitive detector (PSD) measures deflections of the transmitted focus, indicating the presence of transverse index gradients. Its function is complementary to the reflection confocal microscope in that it is optimal for detecting transverse locations while the confocal reflection is optimal at detecting depth locations.

Active confocal. Objects that emit light such as fibers or laser can be directly detected via this light. By filtering the received signal through the confocal microscope, it is possible to locate the peak of the intensity at the focus of the objective lens. Two possible implementations of this are when the light travels directly to the system objective and when it is not directed at the objective but the small bulk scatter of this light off of the polymer is detected. In general, this method enables the circuit to be aligned to the light of an active component or circuit, providing the best possible fabrication tolerances. In some such embodiments, the light must be outside of the absorption band of the photosensitive polymer.

Writing

According to exemplary embodiments, Writing can be divided generally into two primary geometries:

Perpendicular: The part is moved relative to the writing beam in a direction largely perpendicular to the optical propagation direction of the writing beam. Since the natural shape of the writing beam is not circular in this projection, the inscribed index features are not circularly symmetric, typically being longer in the direction of optical propagation of the writing beam. An acousto-optic deflector may be used for rapid arbitrary beam shaping.

Axial: The part is moved relative to the writing beam in a direction largely parallel to the optical propagation direction of the writing beam. If the writing beam is circular, this records a circularly-symmetric feature which matches well to fiber and other circular guided mode devices. This beam can also be shaped to write for example, elliptical guides to match to encapsulated laser diodes.

Note that both cases are extremes of a continuum of possible directions that the part can be moved relative to the writing focus. Varying the power, speed or shape of the writing beam can change the nature of the recorded index to meet a particular need. These variations can be smooth to implement adiabatic waveguide changes or quick to implement, for example, Bragg gratings along a waveguide path.

If the operational wavelength of the circuit is outside the band that initiates polymerization, the circuit can be active during fabrication. Typically the absorption band for polymerization is in the UV to green and decreases rapidly for longer wavelengths. Many circuits operate in the infra-red, making this work quite well. Since all active components (e.g. lasers) or external connections (e.g. fibers) are present during fabrication, it is possible to actively adjust or tune the circuit performance by operating the partially-finished device while still on the lithography station.

Photopolymer Materials

Commercially available photopolymer systems are optimized for low efficiency hologram recording for optical data storage. The photopolymers, therefore, have been designed to have index changes that are linearly proportional to the energy deposited in the material by the incident light. For the highly localized energy densities used in the direct write system, however, the response of the material may be different. It is common to describe the response of the photopolymer to incident light by assuming that the index change is proportional to $I^\alpha$ where I is the writing intensity and a is the single fit parameter for the index change; $\alpha=1$ for linear initiation, $\alpha=2$ for two-photon initiation, and $\alpha=\frac{1}{2}$ for pure radical initiated photopolymers. Different types of photopolymers will have different responses to the incident light. In bulk photopolymerization, $\alpha<1$ is primarily manifested as a reduction in sensitivity. In the case of holography, $\alpha$ 1 also results in the formation of second and higher-order gratings that are not Bragg matched and thus do not contribute to diffraction efficiency.

Broad classes of materials may be utilized according to embodiments of the invention. Material properties divide into the properties of the physical matrix and the photosensitive properties. In exemplary embodiments, the properties of the physical matrix include:

Low absorption, after final processing, at the operating wavelength;

Uniform phase at the wavelength and subwavelength level. The second is equivalent to low volume scatter;

Film thickness greater than ~100 microns; and

Environmentally stable.

In some exemplary embodiments related to encapsulating hybrids, the matrix properties include low shrinkage stress during the liquid to solid transition. This can be accomplished by low total shrinkage, low shrinkage after the conversion to a solid state (before which the liquid will absorb any stress), low modulus, or any combination. In a specific embodiment, a step-growth polymer which has all of these properties.

According to exemplary embodiments, the properties of the photosensitivity are:

High sensitivity, typically at least $10^{-12}$ n/(mJ/cm$^2$) which corresponds to a one Watt laser focused to a square micron for one millisecond to develop an index change of $10^4$. High quality holographic photopolymers have sensitivity on the order of $10^{-6}$ n/(mJ/cm$^2$).

Index change sufficient to establish single-mode guiding at guide diameters of ~10 microns, or roughly $2 \times 10^4$ in the visible wavelength range and two to three times this in the infra-red spectrum. Larger maximum change enables tight bend radii and greater design freedom and is therefore desirable. According to some embodiments, this index change must develop without the need for any wet processing, since this is not compatible with the material thickness. Heat treatment, however, is acceptable and may have the advantage of delaying index development until after all writing has completed.

Sufficiently low absorption of the writing light to allow the focus to efficiently reach the entire depth. 5 to 10% absorption per mm is a typical balance between this constraint and sensitivity.

Some mechanism by which the index change remains permanently after writing. In addition, it is common that the absorption mechanism used to write is "bleached" or reduced to a minimum, although this is not essential. Typical mechanisms are development of index via diffusion (which remains after uniform final exposure) and multi-photon writing in which normal incoherent exposure has insufficient intensity to trigger the reaction.

Exemplary Material Systems Include:

Diffusion of mobile species such as monomer or initiator (dye). These changes are made permanent by a subsequent uniform exposure which consumes the photosensitive specie(s) without driving diffusion. Materials provided by Dupont®, Inphase Technologies®, and Aprilis® Inc are in this category. Current commercially available materials are initiated by single-photon dyes, but multi-photon initiation has been demonstrated with these systems and would reduce the scale of the index feature.

Photochromic index change—an immediate index change upon absorption of light. For this change to be permanent, the writing conditions must be avoided. This could include a linearly sensitive material in which the photosensitive wavelength is permanently blocked. Among others, this could also include a multi-photon initiation for which typical exposure intensity will be significantly below that required to change the material.

Thermally-gated. If the glass transition temperature, Tg, is higher than the operating temperature, diffusion is largely suppressed. Raising the temperature thus allows diffusion and development of index. Maintaining a sample below its Tg thus suppresses the development of index.

Those skilled in the art will appreciate, in light of the disclosure herein, that the foregoing list is not comprehensive. According to exemplary embodiments, any material that satisfies the properties can potentially be used and a number of appropriate existing materials are available.

Those skilled in the art will note that the glass transition temperature Tg has not been specified. According to exemplary embodiments, Tg can be lower than operating temperature in order to accommodate thermal expansion of embedded components and allow for a flexible final part (eg. a ribbon cable). Alternatively, Tg can be higher than operating temperature to form a hard, glassy matrix which may be more appropriate when fabricating waveguides that are open to the environment such as a connector face.

Perpendicular Writing

The relationship between index change and a for perpendicular writing will now be described for exemplary embodiments. Physically, the writing process involves focusing a laser beam with a Gaussian profile into the bulk of a photopolymer slab. The polymer and focused light are then moved transversely relative to one another at some fixed velocity, v, and the index change along a line in the material depends on the integration of the intensity of the beam along that line. Then δn for a photopolymer sample that is translated perpendicularly through a focused Gaussian beam in the x direction will be given by:

$$\delta n(x, y, z) \propto \int_{-d/v}^{d/v} I^\alpha(x + vt, y, z) dt, \quad (1)$$

where v is the linear velocity of the polymer sample with respect to the focused beam, d is the distance the polymer sample is moved in the x direction, and I is the incident intensity profile, which for a Gaussian beam is $$I(x, y, z) = \frac{2P}{\pi w_o^2} \frac{1}{1 + \left(\frac{z}{z_o}\right)^2} \exp\left[-2 \frac{x^2 + y^2}{w_o^2 \left(1 + \left(\frac{z}{z_o}\right)^2\right)}\right], \quad (2)$$

where $z_0$ is the Rayleigh range, P is the incident power, and $w_0$ is the $1/e^2$ intensity radius at the focus.

The polymer is moved a distance that is large in comparison to the Gaussian beam radius at this z plane, and d may be taken as d≈∞. Integrating over this distance traveled in the x direction, the index change becomes $$\delta n(x, y, z) \propto \left(\frac{2}{\pi}\right)^{\alpha-1/2} \frac{P^\alpha w_0^{1-2\alpha}}{v\sqrt{\alpha}} \left(1 + \left(\frac{z}{z_0}\right)^2\right)^{1/2-\alpha} \exp\left(\frac{-2\alpha y^2}{w_0^2\left(1 + \left(\frac{z}{z_0}\right)^2\right)}\right). \quad (3)$$

Figure 4:
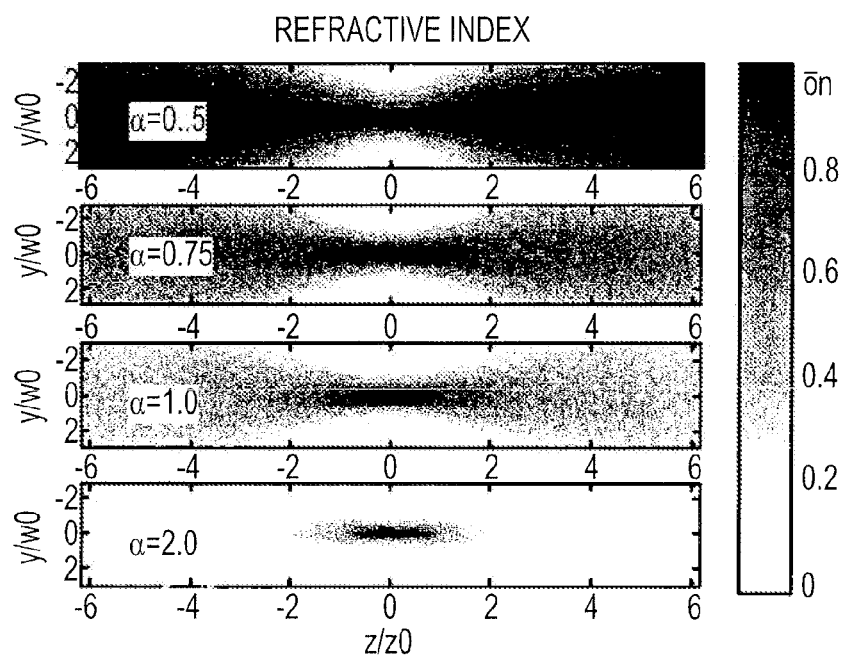
FIG. 4 illustrates exemplary normalized refractive changes created in photopolymers having different values for a using perpendicular writing.

The resulting index structure is continuous in x, with a cross sectional profile in y and z as described in Eq. 1. The refractive index is parameterized by the variable a, which can be adjusted to describe the effective response of the photopolymer to the highly localized energy densities used in this system. FIG. 4 illustrates that as a is increased from 0.5 to 2.0, the index structure varies from a state with no confinement of the refractive index change in z to a full width half maximum of approximately $1.5z_0$ in the z direction. Therefore, in order to create cylindrically symmetric waveguides that support cylindrically symmetric modes, values of a 1 are desirable. As shown in FIG. 4, even for a linear material, where α=1, the feature size in z is longer than the depth of focus of the writing beam due to the translation of the beam transversely through the material and integration of the intensity. Writing in glass with femtosecond lasers also tends to create features with a similar stretching in z, due to self-focusing of the writing beam during the writing process. The photopolymer can potentially avoid self-focusing problems since the index response is delayed due to diffusion.

Parallel Writing

Direct-write lithography system also can be used to write waveguides that are parallel to the propagation of the writing beam. Unlike those written perpendicular to the writing beam, these index structures are naturally cylindrically symmetric due to the cylindrically symmetric nature of the Gaussian beam. The index structure created in the photopolymer is again an integral of the Gaussian beam intensity, this time along the z-axis:

$$\delta n(x, y, z) \propto \int_{-d/v}^{d/v} I_0^\alpha(x, y, z + vt)dt. \quad (4)$$

Figure 5:
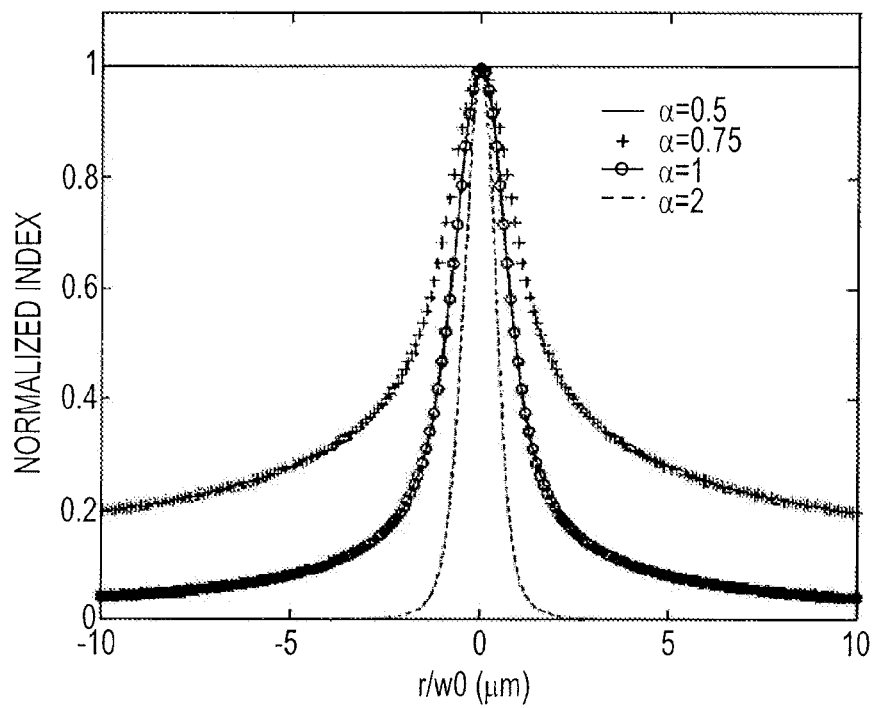
FIG. 5 illustrates exemplary cross sections of refractive index change created in photopolymers having different values of a using parallel writing.

This integral does not have a simple, closed form solution, but numerical integration demonstrates the effect of $\alpha$ on the shape and size of the resulting index structure. FIG. 5 shows the cross sections of this cylindrically symmetric index structure for values of $\alpha$ between 0.5 and 2. As before, the resulting index structure is significantly more confined for higher values of $\alpha$ and for parallel writing, there is no radial confinement for $\alpha=0.5$.

In summary, when writing parallel to the direction of propagation of the beam, the writing beam travels through a greater thickness of polymer than when writing perpendicular. In some embodiments, due to absorption of the writing light in the material, this will result in a tapered waveguide unless the speed or power of the beam is varied during the writing process. However, an index structure written in this way will be naturally cylindrically symmetric, which matches well to a single mode fiber. On the other hand, moving the part perpendicular to the writing beam results in an index structure than is not cylindrically symmetric as seen in FIG. 4, though this can be compensated with beam shaping of the writing laser. Both methods have the potential to write 3D cylindrically symmetric, uniform single mode waveguides, according to exemplary embodiments.

Types of Encapsulated Components

According to embodiments of the invention, suitable microscopic detections methods can be developed to locate virtually any optical, optoelectronic, or electronic component that might be needed in an optical device. This represents a substantial improvement over previously-known technologies, which typically are compatible with only a few hybrid components. Exemplary types of hybrids that can be incorporated includes:

Passive Devices:
  Optical fibers (single or multi-mode, doped, fiber Bragg gratings, photonic crystal, plastic or glass);
  Dielectric thin-film structures (curved or flat mirrors, polarization beam splitters, wavelength-division multiplexors);
  Crystal optics (wave plates, photorefractive crystals, crystal polarizers);
  Lenses (gradient index, spherical or aspheric, diffractive); and
  Waveguides (complex planar lightwave circuits, doped with impurity such as rare earth, arbitrary materials.

Active Devices:
  Lasers (vertical cavity surface emitting, edge-emitting laser diode);
  Electro-optic (modulators, deflectors);
  Acousto-optic (modulator, tunable filter, deflector);
  Liquid crystal (phase modulator, tunable wave plate);
  Photodetectors (PIN, avalanche, bolometer); and
  Nonlinear optics (saturable absorbers, Kerr).

Non-Optical:
  Thermal vias (heat sinks);
  Electrical connections;
  Micro-fluidic channels; and
  Electrical circuits including heating elements and digital or analog control.

Methods of Hybridization

According to embodiments of the invention, the precise, analog control of the 3D index distribution enabled by the combination of the self-developing polymer and the 3D lithography technique makes a large range of hybrid components possible. Other techniques, such as the Dupont® technique of cutting the pre-fabricated waveguide and inserting a thin, parallel optic, put significant constraints on the type of optic inserted, because the waveguides are not modified to fit the needs of the embedded part. Hence, embodiments of the present invention may be employed toward the following exemplary broad classes of hybrid optoelectronics:

Thick transmission optics. After exiting a waveguide, the guided light will significantly diffract in a distance given by its diameter squared over the local wavelength, leading to large optical losses when attempting to couple across embedded optics of large thickness. According to embodiments of the invention, the diameter of the guided mode may be increased, either by an adiabatic waveguide taper, a polymer or hybridized "collimation" lens, or some combination of these methods. This can not be accomplished in planar (2D) circuits since the mode size must be increased in both transverse dimensions.

Nonplanar transmission optics. If a hybrid optic is wedged sufficiently to introduce one wavelength of tilt across the guided mode diameter, significant coupling losses will occur at the receiving guide. This can be avoided, according to embodiments of the present invention, by detecting the wedge and tilting the output guide appropriately to optimally accept the deflected output.

Reflection optics. Turning sharp corners within an optical circuit is of interest to reduce the total circuit size which is often driven by the minimum bend radius of optical waveguides. External and internal facets have been shown, typically with ~1 dB of loss since both the incident and reflected waveguides are fabricated fully to the surface of the mirror, effectively forming a waveguide cross-over at the mirror surface. The same result may be achieved according to embodiments of the invention, by moving the 3D stylus up to and off of the mirror on the desired path. Or, to reduce losses, writing light can be turned off near the mirror surface to leave a small gap such that the two guides do not cross. The size of this gap can be increased by increasing the mode size as discussed above.

Guide-wave light sources. Lasers or fibers encapsulated in the polymer emit coherent light from a small waveguide aperture. According to embodiments of the invention, polymer waveguides can be written directly up to fiber faces, directly coupling the fiber core to a polymer waveguide. A particularly important case is coupling to the elliptical output mode of an edge-emitting semiconductor laser diode. By tapering the shape of the waveguide to support the matched elliptical mode near the laser to a circular mode matched to fiber, we can avoid any "circularization" optics and directly couple the laser efficiently to a guided wave fiber or circuit. A grating written into this guide can also provide an external cavity feedback, drastically simplifying the typical external cavity diode laser (ECDL) packaging.

Those skilled in the art will appreciate, in light of the disclosure herein, that the foregoing list is not comprehensive. It is provided to merely serve to illustrate how the continuously varying, 3D control of index enables the method to incorporate virtually any optical device.

Types of Optics that can be Formed:

The analog control of index plus the 3D control of the writing intensity can be exploited to fabricate a wide range of passive optical devices within the body of the material. Exemplary devices according to representative embodiments include:

Waveguides:
Uniform cross-section: symmetric (either via axial writing or beam shaping with perpendicular writing) or asymmetric. Single or multi-mode. Polarization insensitive or polarization-preserving.

Tapered waveguides: variations of guide size, shape or orientation as needed. A particularly important example is the tapering of mode size from typical fiber mode diameters of ~10 microns up to ~10 times this size in order to reduce diffraction losses and tolerances across unguided regions. For example, fiber connectors for technologies such as 10 Gb Ethernet cost 100's of dollars due to the 1 micron alignment tolerances. Increasing the allowable tolerance by a factor of 10 through tapering of the modes would drastically reduce the cost of the connector.

3D routed waveguides: Typical planar lightwave circuits can not cross waveguides without a loss penalty. In this technology, the $3^{rd}$ dimension can be exploited to cross guides without intersections. Complex permutations are possible in linear or 2D arrays of waveguides to implement arbitrary interconnects in cables or connectors. Also, 3D routing enables long delay lines in a small package.

Various splitters (directional couplers, Y-branches, multi-mode interference devices)–in 2 dimensions not just in plane.

Flexible waveguides (if Tg is lower than the operating temperature) such as ribbons.

Note that waveguides are gradient index (not step index) in both dimensions for reduced dispersion and thus higher bandwidth. Gradient index guides also typically do not incur loss due to side-wall roughness, which is common in lithographically formed guides. The resulting waveguides in this method are thus expected to have the maximum possible bandwidth and potentially very low loss which are the two primary performance characteristics of such systems.

Diffractive structures
The holographic photopolymer materials are optimized for the formation of diffraction gratings via interference lithography. This can be combined in the same volume with waveguides in order to form gratings along the waveguide (e.g. to implement a spectral filtering function similar to a fiber Bragg grating) or in arbitrary orientation (e.g. to implement a grating coupler out of the waveguide). In other waveguide technologies, such gratings can not be formed so simply.

Grating structures can also be formed via masks or with the direct-write process itself. For example, by periodically changing some parameter of the waveguide as it is written, one can write a Bragg grating along its length.

Note that if light of the writing wavelength is directed down a guide simultaneous with counter-propagating, coherent light of the same wavelength, a reflection grating is self-exposed. This is an extension of the method of self-writing waveguides (discussed in the prior art) to self-write a Bragg-matched reflection hologram at the particular color. An important use of this technique would be to write a reflection hologram that would provide a narrow-band reflection into an encapsulated laser-diode in order to implement a small, robust external cavity diode laser (ECDL). By tuning the grating (see below) the color of the laser can be tuned.

Refractive structures
Gradient index lenses
Prisms

Moreover, particularly for the case when the material is operating above its glass transition temperature (although not restricted to this case) the material can be thermally or mechanically stretched or bent. Stretching or compressing a grating enables tunable diffraction. The thermo-optic or stress-optic effects can be used to implement phase shifters.

Other representative embodiments provide:
Electro-optic polymer: Polymer formulations may be used in which an electric field applied to the polymer alters its refractive index. By using an EO polymer according to embodiments of the invention, electro-optic function could be implemented.

Acousto-optic: A piezo-electric transducer (i.e. a high-frequency speaker) can launch acoustic vibration waves across the polymer. These waves can locally change the index of refraction to create a dynamic hologram or grating.

Doping: Various materials can be added to the polymer in order to impart optical function. For example, rare-earth elements such as erbium can be doped into the polymer. These erbium atoms will absorb light at ~980 nm and fluoresce at ~1550 nm. This fluorescence can be exploited to amplify light at 1550 to make an optical amplifier or a laser.

Nonlinear optics: Either through the inherent polymer properties or through doping with another material, the local index of refraction can be temporarily altered by the intensity of light. This Kerr nonlinearity can cause self-focusing or soliton propagation, for example.

Stress-optic: Mechanical tuning was mentioned. Another version of this is that stress applied to the material may cause an index change directly—this is what is exploited by the acousto-optic devices. A pressure can thus induce index perturbations to make a switchable or slowly modulated function.

Micro-electro-mechanical Systems (MEMS): Since the material is flexible, it may be possible to embed MEMS devices or piezos within the polymer in order to locally move or stress an embedded optic or the polymer itself.

CONCLUSION

A direct-write lithography device and associated methods has been described. According to representative embodiments, the system is capable of writing index structures in diffusion-mediated photopolymer that are confined transversely and longitudinally with respect to the writing beam. These structures can be created at any depth within the volume of the photopolymer and have peak index changes on the order of $10^{-3}$ when written with powers on the order of 10 μW at a speed of 2 mm/s. This index change is not a fundamental limit of the materials used, and larger index changes may be possible with greater writing intensity. Embodiments provide sufficient index change and control over the index structures to create single mode waveguides. Representative embodiments described herein exhibit one or more of the following features:

The use of a self-developing photopolymer with 3D direct-write lithography to form waveguides or other passive optics in a large (mm-scale) volume.

The dynamic control of the 3D stylus to write polymer gradient-index waveguides with variable tapers, shape, 3D path and orientation.

The use of this type of polymer as an encapsulation material in order to support hybrid integrated optoelectronics.

The integration of microscopic component detection optics into the 3D lithography station in order to locate the positions, orientations and fabrication tolerances of the embedded hybrid components.

The use of this information to customize an interconnection circuit to the locations of the parts, aligning the circuit to the components and not the traditional inverse operation in which components are actively aligned to a lithographically formed circuit.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention, which is defined in the following claims.

What is claimed is:

1. A method of creating a smooth region of index change in a photopolymer, comprising:
   providing a photopolymer having a photosensitivity to light of a particular wavelength;
   generating, using a continuous wave light source, a writing beam that includes the particular wavelength;
   translating the writing beam in each of three dimensions while adjusting a shape, power, or exposure time of the writing beam based on interactions between the photopolymer and the writing beam to create patterns having a smooth refractive index change and a uniform cross section in the photopolymer in response to a time integral of an intensity of the writing beam.

2. The method of claim 1, wherein the smooth refractive index change comprises a trajectory through space.

3. The method of claim 1, wherein the smooth refractive index change comprises an optical device.

4. The method of claim 3, wherein the optical device comprises a selection from the group consisting of:
   lens;
   waveguide;
   grating; and
   prism.

5. The method of claim 1, further comprising providing a dopant doped into the photopolymer.

6. The method of claim 1, further comprising exposing the photopolymer to uniform incoherent light to thereby cure the polymer.

7. The method of claim 1, wherein the writing beam has a Gaussian profile.

8. The method of claim 1 wherein translating the writing beam and the photopolymer with respect to one another occurs at a constant velocity.

9. The method of claim 1 further comprising selecting a speed of translation of the writing beam and the photopolymer with respect to one another to control a shape of the smooth refractive index change based on diffraction of the writing beam and the interaction of the writing beam with the photopolymer.

10. The method of claim 1, further comprising selecting a variable exposure of the writing beam that includes variations in the shape, power, or exposure time result in an amount of index change primarily in a direction of propagation of the writing beam that is related to the depth of focus of the writing beam.

11. The method of claim 1, further comprising shaping the continuous wave light source to provide an analog intensity profile of the writing beam.

* * * * *